United States Patent [19]

Apap et al.

[11] Patent Number: 5,145,104

[45] Date of Patent: Sep. 8, 1992

[54] SUBSTRATE SOLDERING IN A REDUCING ATMOSPHERE

[75] Inventors: Joseph A. Apap, Endicott; Mark A. Brown, Whitney Point, both of N.Y.; Alan J. Emerick, Warren Center, Pa.; Thomas L. Miller, Vestal, N.Y.; James R. Murray, Owego, N.Y.; David W. Sissenstein, Jr., Endwell, N.Y.

[73] Assignee: International Business Machines Corporation, Armonk, N.Y.

[21] Appl. No.: 672,804

[22] Filed: Mar. 21, 1991

[51] Int. Cl.$^5$ .............................................. B23K 31/02
[52] U.S. Cl. .................................. 228/179; 228/180.1
[58] Field of Search ................ 228/179, 180.1, 180.2, 228/118, 245, 248, 253

[56] References Cited

U.S. PATENT DOCUMENTS

| | | | |
|---|---|---|---|
| 3,599,326 | 8/1971 | DiRenzo | 228/118 |
| 3,719,981 | 3/1973 | Steitz | 29/423 |
| 3,900,151 | 8/1975 | Schoer et al. | 228/220 |
| 4,164,064 | 8/1979 | Reavill | 228/253 |
| 4,240,574 | 12/1980 | Schmatz et al. | 228/219 |
| 4,396,140 | 8/1983 | Jaffe et al. | 228/253 |
| 4,462,534 | 7/1984 | Bitaillou et al. | 228/180 |
| 4,538,757 | 9/1985 | Bertiger | 228/180.1 |
| 4,632,295 | 12/1986 | Brusic et al. | 228/123 |
| 4,646,958 | 3/1987 | Howard, Jr. | 228/220 |
| 4,728,023 | 3/1988 | Barajas et al. | 228/180.1 |
| 4,759,491 | 7/1988 | Fisher | 228/56.1 |
| 4,842,184 | 6/1989 | Miller, Jr. | 228/253 |
| 4,871,110 | 10/1989 | Fukasawa et al. | 228/245 |
| 4,919,729 | 4/1990 | Elmgren | 148/24 |
| 4,921,157 | 5/1990 | Dishon et al. | 228/220 |
| 4,979,664 | 12/1990 | Lyons et al. | 228/219 |

FOREIGN PATENT DOCUMENTS

| | | | |
|---|---|---|---|
| 0072663 | 4/1985 | Japan | 228/180.1 |
| 0321686 | 12/1989 | Japan | 228/180.1 |

OTHER PUBLICATIONS

IBM Technical Disclosure Bulletin vol. 20, No. 2, Jul. 1977 by Rivenburgh et al., pp. 545-546, "Cast-Solder Preloading For Stacked Modules".
Research Disclosure, Jun., 1989, No. 302, "Solder Ball Reflow".
IBM Technical Disclosure Bulletin vol. 30, No. 7, Dec. 1987, p. 124, "Ball And Chip Placement Wafer".
Western Electrical Technical Digest No. 2, Apr. 1966 by Costello, "Method of Soldering A Pin To A Sleeve".

Primary Examiner—Kurt Rowan
Assistant Examiner—Chuck Y. Mah
Attorney, Agent, or Firm—Judith D. Olsen; Bernard Tiegerman

[57] ABSTRACT

An improved method and apparatus for making solder connections from input/output connecting pins to the circuitry on a pinned metallized ceramic substrate. A solder preform in the shape of a sphere provides the correct volume of solder. These spheres are held in position at each desired joint by a templet. The substrate, solder sphere and templet assembly is passed through a furnace in a reducing atmosphere and at a temperature to facilitate solder reflow and wetting, thus creating a sound mechanical and electrical connection between the pin and its portion of the circuitry. The method and apparatus of the invention provides joints have a high degree of reliability such that all connections are made to acceptable soldering standards, none lacking integrity. Only harmless by-products are produced in the practice of the invention, and no residue is produced which requires cleaning by means of chemical solvents and therefore is environmentally superior.

13 Claims, 2 Drawing Sheets

SUBSTRATE SOLDERING IN A REDUCING ATMOSPHERE

BACKGROUND OF THE INVENTION

1. Field of the Invention

The present invention relates to the manufacture of electronic modules, and more particularly to the soldering of connecting pins to conductor lands defined upon a surface of a circuitized dielectric substrate, typically comprised of a ceramic material. The pins provide electrical and mechanical connections to the outside world, and providing these connections absolutely reliably is an ongoing problem in the integrated circuit packaging art. The method and apparatus of the invention are particularly suitable for use in highly integrated, high density applications.

Most particularly, the present invention relates to a fluxless method and apparatus for providing precision solder connections which does not involve the use of pyrollidones, chlorofluorocarbons, perchloroethylene, or other halogenated solvents or any other chemicals the use of which is now considered to be environmentally inadvisable.

2. Background Art

Circuitized ceramic substrates are mounted to printed circuit boards or cards (PCBs) in order to enhance the electronic capabilities of the package. Typically, connector pins are positioned in holes formed in the ceramic at selected termination areas called lands on the metallized, circuitized "top" surface of the ceramic substrate. The head of each connector pin is soldered to a land in order to make reliable mechanical and electrical contact. The tail end of the connector pin emerges from the unmetallized, "bottom" surface of the ceramic substrate in order to make contact with a board or card or with another circuitized ceramic substrate.

Soldering establishes a bond between a solderable base material, typically, but not limited to, copper or gold plated copper, and a solder material, typically, but not limited to, a Pb-Sn alloy. In order to form a bond, the solder must wet the base material. In the manufacture of pinned substrates, the solder must wet both the head of each pin and the circuit pad to which it is intended to be soldered. If, as has been known in the art to happen from time to time, wetting is incomplete, the melted and hardened solder overhanging the pin head will leave a gap in which impurities can condense, and the resultant electrical/mechanical connection will be both discontinuous and unamenable to discovery by nondestructive microscopic examination techniques.

The process normally used to solder the lands of metallized ceramic substrates to pin heads involves use of a flux. Whereas flux is useful in many soldering applications, its use in high density packaging applications is limited. Components of the flux which remain within the solder, such as abietic acid from the flux resin, tend to "spit" flux components and solder balls under temperatures encountered during subsequent processing, a phenomenon which can cause solder shorting between closely spaced lands and lines. Flux may become trapped under the head of the connecting pin, interfering with the integrity of the connection.

The use of flux in a soldering process has been known in the art for many years. Flux serves the purpose of promoting adhesion between solder and metal soldered. If the metal to be soldered tends to form an oxidized surface layer in air, as does copper, the flux provides a cleansing medium. Different ways to solder using an aligning plate are known in the art. For example, U.S. Pat. No. 4,871,110, issued Oct. 3, 1989 to Fukasawa et al describes a duplex arrangement of aligning plates, the bottom of which employs vacuum to position solder balls onto holes, which technique is intended to overcome the problem of solder balls adhering to one another due to static electricity. The alignment plates themselves are glass or ceramic, the diameter of the vacuum holes in the bottom alignment plate being smaller than the solder balls and the diameter of holes in the top alignment plate being larger than the solder balls. There is no mention of the elimination of liquid fluxing chemicals, however, and the duplex fixturing plus vacuum is more complex and quite different from the technique of the present invention.

Because of the cleansing properties of the flux, it is not necessary to reflow the solder in a reducing gas even when gas reflow of solder is used, as described in IBM Technical Disclosure Bulletin Vol. 20, No. 2, published July, 1977 by Rivenburgh et al, which describes the use of a vacuum-vibration solder plate fixture which is made of anodized aluminum, stainless steel or graphite, materials described as being non-wettable by the solder. The fixture described restricts solder movement during reflow, functioning more in the nature of a solder mask than a positioning plate, and the use of liquid flux is also described.

U.S. Pat. No. 4,462,534 issued Jul. 31, 1984 to Bitaillou et al. is assigned to the same assignee as is the present invention. The '534 patent describes the positioning of solder balls on the heads of connecting pins on a ceramic substrate using liquid flux without an alignment plate. The '534 patent describes a technique which the present invention, a reducing technique in combination with an alignment plate, is intended to replace.

Likewise Research Disclosure, June, 1989, Number 302, published anonymously, describes using solder balls and liquid flux. A plate fixture is also used, but not for positioning the solder balls, merely for restraining the solder balls from moving.

Fluxless processes for applying solder balls are also described in the art. For example, U.S. Pat. No. 3,719,981 issued Mar. 13, 1973 to Steitz describes positioning of solder balls in the absence of flux by arraying the solder balls on the tacky surface of a piece of pressure sensitive tape, such as "Scotch" brand, and a combination of masks. The tape is removed after solder reflow.

IBM Technical Disclosure Bulletin Vol. 30, No. 7, published December, 1987 by a present inventor, describes a heat dissipatable flux or wax membrane for positioning solder balls.

Of course, neither of these processes is applicable to the high density, solvent free application of the present invention in which processing conditions and demands for cleanliness do not permit the use of glued cellulose tape or wax.

U.S. Pat. No. 4,632,295 issued Dec. 30, 1986 to Brusic et al and 4,919,729 issued Apr. 24, 1990 to Elmgren et al are useful for their descriptions of furnace soldering in a reducing atmosphere. The former includes an application step of dehydric or polyhydric alcohol, however, and the latter teaches away from the use of solder preforms and templets when light dimension tolerances are required, in contrast to the present invention.

Western Electrical Technical Digest No. 2, published April, 1966 by Costello describes the use of an anodized aluminum fixture for soldering but the fixture functions as a sleeve for the pin, the seam of which is to be soldered rather than the head, unlike the present invention.

Any flux residues must be removed subsequent to soldering. The solvents used for flux residue removal include halogenated organics, pyrollidones and other chlorofluorocarbons. It would be helpful to eliminate these solvents from the solder process, as they have been identified as being environmentally inadvisable. While liquid solder flux in general is not a fixed composition, commonly found ingredients also include abietic acid and other pine derivatives. These materials may remain in the solder and erupt, or "spit" suddenly during times when the solder is reheated, potentially contaminating high density electronic devices. Perchlorethylene, methylene chloride or Freon type solvent rinsing is typically used to remove flux residue. These solvents tend to leave behind difficult-to-remove halogen ions, and the used rinse requires special handling, typically involving distillation, tank farms or trucking, in order to minimize release to the environment. Some emissions do escape to the atmosphere after treatment in a carbon absorption unit.

It is also known to solder dip all or part of a circuitized substrate. For grossly dimensioned applications, dipping may result in an acceptable product, as gaps where solder does not wet may not make a practical difference. However, for both grossly dimensioned and high density applications, the present method and apparatus, wherein the solder is directed and limited to the exact places where it is needed and wherein wetting is complete, reliable and reproducible, is effective. The method and apparatus of the invention are simple, replacing a costly S.T.E.P. (Substrate Tinning Enhancement Program) machine, which requires debugging and has been used for soldering in 100 mil pin grid devices but not for interstitial and denser pin grids.

It has been demonstrated, in connection with 50 ml grid arrays, that the present invention is useful for soldering about one million solder balls in a six hour period.

Nothing in the art describes the fixture of the present invention in combination with a reducing gas soldering atmosphere, which permits precision soldering, thereby obviating the need for chlorofluorocarbon or other organic solvent.

SUMMARY OF THE INVENTION

Accordingly, it is an object of the invention to provide a solder joint of high mechanical and electrical integrity.

It is a further object of the invention to provide an environmentally sound method of soldering.

It is a further object of the invention to create a plurality of solder joints simultaneously, 100% of which conform to the definition in the art of soldering of a quality joint of unquestionable reliability, requiring no rejection or rework.

It is a further object of the invention to provide a fixture for precision soldering of high density devices using solder ball preforms.

Still another object of the invention is to provide a means to supply one solder ball to the head of each of an array of connector pins on a circuitized substrate for soldering the pin head-to-circuitization connection.

The foregoing and other objects and advantages are accomplished in the present invention by means of a fixture, called a templet, which is comprised of a material, such as titanium, graphite, stainless steel or ceramic, or metals such as steel plated chromium or titanium nitride, which does not itself solder at the temperatures of the process of the invention and which is indefinitely reusable and substantially damage resistant. When comprised of metal, the templet dissipates any electrostatic charge that may be present on the solder balls. However, where electrostatic charge is not a problem to begin with, a non-metallic templet is also suitable. The templet includes an array of depressions, or blind holes, having a circular diameter, each diameter being slightly larger than the solder preform which it is adapted to receive, and each preform in turn corresponding to a pin head preselected for soldering. The solder preform is in the shape of a ball or sphere in order to provide a reproducible predetermined amount of solder at each soldering site. The templet, furnished with solder balls, is placed solder-ball-side up. The substrate is aligned above the templet pin-head-side down by locators on the templet, and its weight rests on the solder balls held in place on the templet. The alignment achieved provides contact between the solder ball preform and the pin head to be soldered at the moment of reflow. The solder is reflowed in a reducing gas atmosphere, which makes possible the wetting and bonding of the pin head and land by the solder. Since the only by-products of the gas process are harmless, residual by-products of liquid flux processes are eliminated, eliminating also "spitting" of liquid flux, the need for cleaning and for other liquid flux related process steps.

In the reducing atmosphere method of the present invention, there are no liquid flux related impurities to collect, and the reducing gas atmosphere, comprising for example hydrogen, forming gas or less preferably carbon monoxide, of the method removes copper oxide from copper pins and lands, permitting wetting of all areas to be soldered. In addition the solder ball up - pin head down alignment also contributes to pressing the solder down around the perimeter of the pin head to make contact with the land, as solder is reluctant to go around outside corners as defined by the relationship between the top of the pin head and its side.

The clean and oxide-free metal areas to be soldered have an affinity to the solder; the dielectric regions do not. This effect provides a self-correction which forgives slight misalignment between the templet and the pin heads on the circuitized substrate.

DESCRIPTION OF THE PREFERRED EMBODIMENTS

In order to facilitate understanding of the present invention, reference is made to the following detailed description taken in conjunction with the above described drawings.

Figure 1:
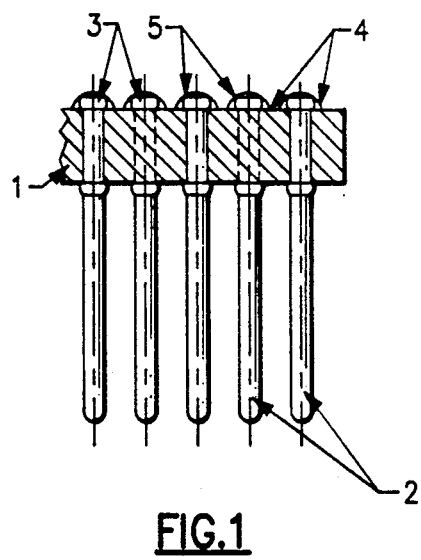
FIG. 1 is a cross-sectional view of a circuitized ceramic substrate with a plurality of pins attached and solder connected to the circuitization at lands. This figure represents the acceptable final product configuration; it is ready to be mounted onto a second device.

FIG. 1 shows the final pin-to-circuit connection produced by the method and device of the present invention. The substrate 1 comprises a dielectric material such as ceramic or glass/polymer, formulated to functional specifications as an electrical device as well as to its ability to withstand soldering temperatures without degradation. To form the desired electrical and mechanical connection, the inventors have used 10% Sn/90% Pb solder 5, which has a melting point of about 310 degrees C. However, a lower or higher melting point solder of various compositions may be used provided the materials being exposed to the particular temperature are compatible therewith. Hydrogen gas can be used as a reducing atmosphere in temperatures high enough for high temperature brazing (greater than 538 degrees C. up to about 1100 degrees C.). On both copper and gold plated copper the best bonds form above 350 degrees C. The connector pins 2 have been affixed in through holes in the substrate to form an assembly. The pinning operation forms a head 3 in the pin according to means known in the art. The pins themselves are comprised of a material known to have good properties of electrical conductivity and solderability, such as copper or gold plated copper. The circuitry 4 previously affixed to the surface of the substrate by any of various methods known in the art is also specified to be a solderable material.

Figure 2:
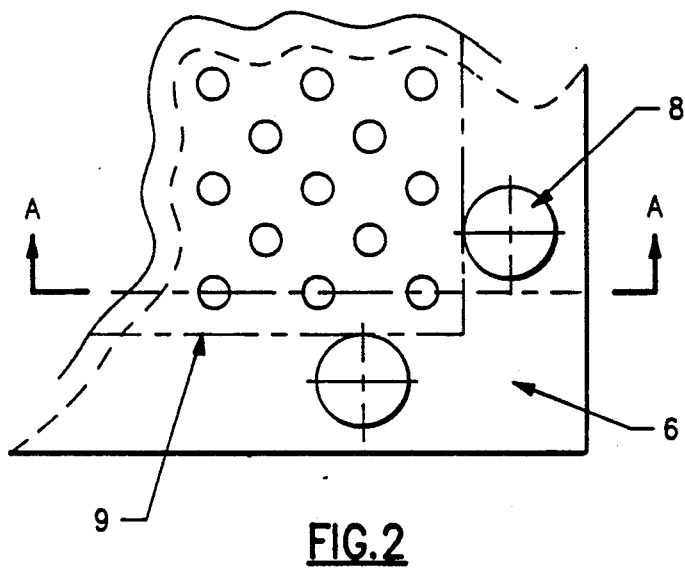
FIG. 2 is a detailed top view of the templet used to hold the solder ball preforms and locate them at the pin heads of the pinned ceramic substrate.

FIG. 2 shows the templet 6 with blind depressions 7, each of a depth and diameter sufficient to retain a solder ball preform. The templet is made of a durable, non-solderable material, preferably titanium. Titanium is a material which exhibits thermal expansion properties which are compatible with the ceramic circuitized substrate in the practice of the present invention. A blind depression 7, also called a blind hole, corresponds in number and position to each desired solder connection on the final product. Locator pins 8 in the corners, position and hold the substrate shown in phantom lines 9.

Figure 3:
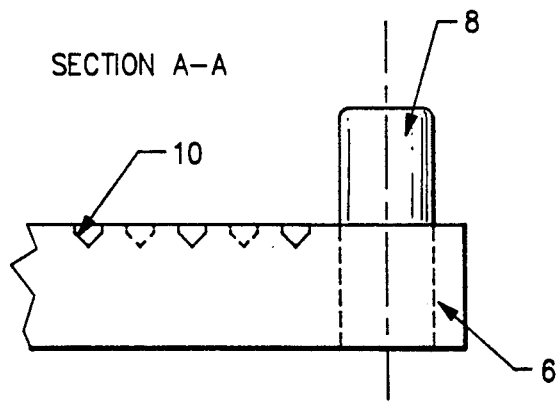
FIG. 3 is a cross-section view showing a portion of the templet, including representative holes adapted to receive solder balls and a representative locator for positioning the templet and the ceramic substrate relative to each other.
Figure 4:
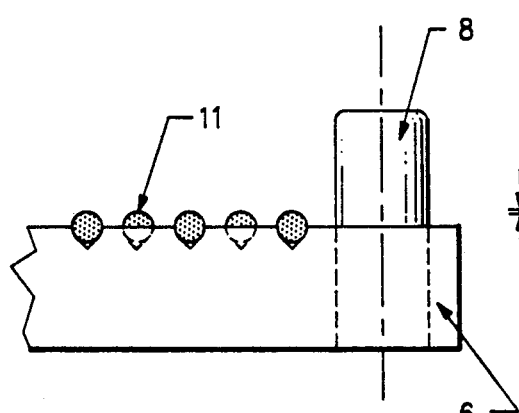
FIG. 4 is a cross-sectional view of the templet showing solder balls in place.
Figure 5:
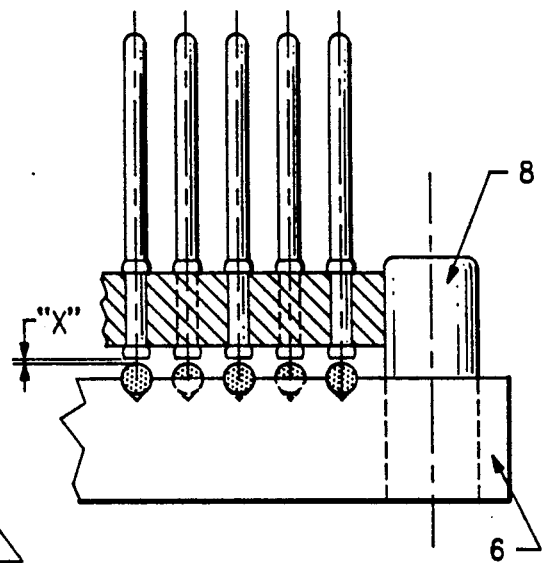
FIG. 5 is a cross-sectional view of a ceramic substrate, solder spheres, and templet in position prior to reflow.

FIG. 3 shows a typical partial cross-section through the templet 6 again showing the locator pins 8 and blind depressions 7. The templet 6 is covered with solder balls 11 in each desired position as shown in FIG. 4. A substrate is then placed with the pins 2 up and the heads 3 down over the solder balls 11 and located within the templet 6 between the dowel pin locators 8 as shown in FIG. 5. In most cases, but not essential to the process, the pin head rest against the solder ball at this stage of process. FIG. 5 shows a slight gap indicated as X.

The substrate 1 exerts its weight through the pin heads downward and against the solder balls and remains unimpeded from downward travel as the reflow of the solder takes place in subsequent operations. The collapse of the solder balls at reflow will allow the gap represented by X to disappear and contact to be made between the solder and the pin head. The assembly, including the substrate 1, the templet 6 and the solder balls is then placed in a furnace with a reducing atmosphere. While other gases or mixtures of gases can be used, such as forming gas, pure hydrogen has been shown to provide reflow and wetting for lead-tin solder on gold or copper circuitry and pins and is preferred. The atmosphere in the furnace should contain less than 1 ppm oxygen, but acceptable reflow has been shown with up to 10 ppm. It is desirable to have as little oxygen as possible, however, preferably none. The atmosphere within the furnace should include less than 50 ppm moisture, with no moisture preferred. For the materials used in the invention as presently described, the temperature should be between 300 degrees C. and 500 degrees C., preferably 350 degrees C. to 450 degrees C. The hydrogen flow should be 175 to 210 standard cubic feet per hour for a 6" by 6" cross-section belt furnace, injected into the middle of the furnace, which corresponds to the highest temperature zone. The speed of the belt should be adjusted to allow the assembly to remain from about 5 to about 15 minutes in the reducing atmosphere. Full reflow and wetting will take place in the peak temperature of 350 degrees C. to 450 degrees C.

Figure 6:
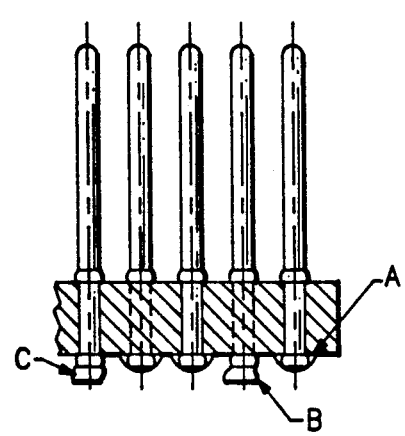
FIG. 6 is a detailed cross-sectional view of a ceramic substrate after solder reflow and removal of the templet.
Figure 7:
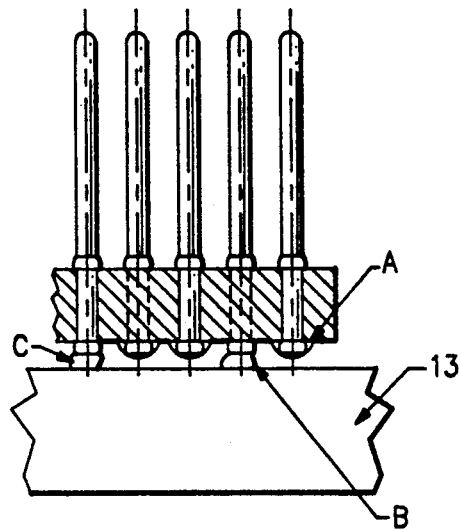
FIG. 7 is a cross-sectional view of a substrate positioned on a flat plate prior to an optional second reflow.

The above conditions provide an example and represent actual conditions. Changes to the components may require variations of parameters, but those described were suitable in all cases tested. Upon reflow in the furnace the solder connections will take on three possible configurations as shown in FIG. 6. Condition B shows minimal wetting of the solder, condition C shows incomplete wetting and condition A shows complete wetting. The assembly, after passing through the cooling zone of the furnace, is brought out of the furnace into room air. The substrate is removed from the assembly and optionally transferred to a flat plate as shown in FIG. 7. This second templet, a featureless flat plate, is constructed of a material such as ceramic or titanium to which solder will not wet or bond. Titanium proved to be an acceptable material in all cases. The flat plate 13, contacted with the substrate, are again passed through the furnace with the atmosphere and temperatures the same as described before. In this part of the process, if there remain any areas of incomplete solder wetting such as shown in FIG. 6 as B and C, they will reflow fully to the desired condition shown in FIG. 6 as A. The weight of the substrate on the solder against the flat plate 13 forces the solder into the desired wetting path during reflow.

The substrate at this point is ready to be completed as a module which involves the attachment of an electrical device known as a chip, and subsequently to be pinned to a PCB or printed circuit card.

Tests were run on joints soldered according to the present invention as follows:

The purpose of the tests was to determine the suitability of the present invention for use in building modules.

The products tested were interstitial metallized ceramic substrates each having an aluminum oxide base structure and 304 gold plated copper I/O cinnector pins inserted into the interstitial through-holes, the pins having 0.050 inch×0.070 inch center-to-center spacing. The templet, use of which made posible the solder joint preparation, was made of machined titanium. Solder ball preforms having 0.025 inch diameter were positioned in the hemispherical depressions of the templet.

The solder balls, obtained from Alpha Metals Corporation, were 10% tin/90% lead.

Joints prepared according to the present invention were tested for functional reliability when functionally stressed, meaning that electrical measurements were made of the soldered joints to test the effect of thermal cycling. It was intended to cycle to failure. The soldering and the thermal cycling were both effected in a continuous belt furnace six inches wide manufactured by Lindberg. Belt speed was 11 ft./min. The atmosphere within the furnace was hydrogen at a flow rate of 210 standard cubic feet per hour. The oxygen level was kept under 10 parts per million (ppm) and the moisture under 50 ppm as metered unless otherwise noted. The following specific test results were noted.

Solder joints were inspected both visually, under a microscope and electrically for shorts due to the solder ball "spitting". No spitting of solder was detected.

90 degree mechanical pull tests were performed to determine whether the soldered joints conformed to specification. No problems were noted, and there were no joints that had not been wetted by solder.

250 substrates were subjected to twenty minute thermal cycles to a peak temperature and back. The temperature was cycled from 0 degrees C. to 100 degrees C. and back, for about 1300 of these cycles.

Zero failures were detected. The same thermal cycling was performed in the presence of 80% relative humidity; zero failures were detected.

Auger and electron microprobe surface analyses detected no residuals from the soldering process. Cross sectional observation revealed 100% acceptable joint formation.

No corrosion or hydrogen embrittlement was detected.

The test results confirmed the present invention superior to all known in the art.

The method and apparatus of the present invention is not limited to soldering pin heads to lands on circuitized ceramic, but is potentially useful whenever it is necessary or desirable to precision solder in the absence of liquid flux. It is understood that the invention may be embodied in modifications without departing from the spirit or central characteristics thereof. The aforementioned examples and embodiments are therefore to be considered in all respects as illustrative rather than restrictive, and the invention is not to be limited to the details given herein.

What is claimed is:

1. A method of soldering, comprising the steps of:
   providing a templet, which is itself not solderable, said templet including a plurality of depressions for receiving solder ball preforms;
   positioning said templet depression side up and providing a solder ball preform in each of the depressions, each such solder ball preform being essentially free of flux;
   aligning said templet provided with solder ball preforms relative to a substrate having a plurality of preselected sites for soldering, and contacting the solder ball preforms to the respective preselected sites;
   passing the templet and substrate through a furnace having a reducing gaseous atmosphere at a temperature sufficient to effect oxide removal, melt solder, and effect solder joining;
   subsequently cooling the soldered substrate; and
   removing the templet from said substrate, placing a surface of said substrate bearing said solder face down onto a flat featureless surface and reflowing said solder in a furnace having a reducing gaseous atmosphere, and cooling the soldered substrate.

2. The method recited in claim 1 wherein the solder ball preforms which are provided on the template comprise a tin-lead solder.

3. The method recited in claim 2, wherein the tin-lead solder comprises about 10% Sn and about 90% Pb and, during said passing step, the temperature of the furnace is held at a temperature above about 300 degrees C. up to about 500 degrees C.

4. The method recited in claim 1, wherein the material of which the templet is comprised is selected from the group consisting of titanium, graphite, stainless steel and ceramic.

5. The method recited in claim 1, wherein the material of which the template is comprised is selected from the group consisting of steel, aluminum and copper, rendered non-solderable by coating the surface provided with depressions with a material selected from the group consisting of chromium and titanium nitride.

6. The method recited in claim 1, wherein the reducing gaseous atmosphere is comprised of a gas selected from the group consisting of hydrogen, forming gas and carbon monoxide.

7. The method recited in claim 6, wherein the reducing gaseous atmosphere comprises less than about 10 ppm volume of oxygen and less than about 50 ppm moisture delivered in such volume and time duration to facilitate chemical reduction of metallic oxides and the solder wetting of desired surfaces.

8. The method recited in claim 1, wherein the substrate to be soldered is a ceramic substrate having circuitry disposed thereon.

9. The method recited in claim 1 wherein the substrate is provided with connecting pins and each depression of the templet corresponds to a pin head to be soldered.

10. The method recited in claim 1 in which said templet comprises a material which is not itself solderable at the temperatures to which it is exposed during use, an array of depressions positioned in the material, each depression corresponding to a location on a workpiece which is to be soldered, and means, projecting from said material, for aligning the templet relative to said workpiece.

11. The method recited in claim 1 wherein said flat featureless surface is comprised of non-solderable material.

12. The method recited in claim 11 wherein the non-solderable material of which the flat featureless surface is comprised is a material selected from the group consisting of titanium, graphite, stainless steel and ceramic.

13. The method recited in claim 11, wherein the non-solderable material of which the flat featureless surface is comprised is a material selected from the group consisting of steel, aluminum and copper, rendered non-solderable by coating the flat featureless surface with a material selected from the group consisting of chromium and titanium nitride.

* * * * *